US009391114B2

(12) United States Patent
Chuang et al.

(10) Patent No.: US 9,391,114 B2
(45) Date of Patent: Jul. 12, 2016

(54) SEMICONDUCTOR DEVICES, METHODS OF MANUFACTURING THEREOF, AND IMAGE SENSOR DEVICES

(71) Applicant: Taiwan Semiconductor Manufacturing Company, Ltd., Hsin-Chu (TW)

(72) Inventors: Chun-Chieh Chuang, Tainan (TW); Dun-Nian Yaung, Taipei (TW); Feng-Chi Hung, Chu-Bei (TW); Min-Feng Kao, Chiayi (TW); Jeng-Shyan Lin, Tainan (TW); Chun-Ming Su, Kaohsiung (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/326,268

(22) Filed: Jul. 8, 2014

(65) Prior Publication Data

US 2015/0115389 A1 Apr. 30, 2015

Related U.S. Application Data

(63) Continuation-in-part of application No. 14/063,953, filed on Oct. 25, 2013.

(51) Int. Cl.

| | |
|---|---|
| ***H01L 31/00*** | (2006.01) |
| ***H01L 27/146*** | (2006.01) |
| ***H01L 23/48*** | (2006.01) |
| ***H01L 21/48*** | (2006.01) |
| ***H01L 23/58*** | (2006.01) |
| *H01L 23/31* | (2006.01) |
| *H01L 23/522* | (2006.01) |

(52) U.S. Cl.

CPC ........ *H01L 27/14636* (2013.01); *H01L 21/486* (2013.01); *H01L 23/481* (2013.01); *H01L 23/585* (2013.01); *H01L 27/1464* (2013.01); *H01L 27/1469* (2013.01); *H01L 27/14634* (2013.01); *H01L 27/14687* (2013.01); *H01L 23/3114* (2013.01); *H01L 23/522* (2013.01); *H01L 2924/0002* (2013.01)

(58) Field of Classification Search

CPC ..... H01L 33/62; H01L 51/56; H01L 51/0072; H01L 2251/301; H01L 43/08

USPC .......................................... 257/460; 438/667

See application file for complete search history.

(56) References Cited

U.S. PATENT DOCUMENTS

| | | | |
|---|---|---|---|
| 8,653,676 | B2 | 2/2014 | Kim et al. |
| 8,981,510 | B2 | 3/2015 | Chuang et al. |

(Continued)

FOREIGN PATENT DOCUMENTS

| | | |
|---|---|---|
| TW | 201320259 | 5/2013 |

*Primary Examiner* — Andy Huynh

(74) *Attorney, Agent, or Firm* — Slater Matsil, LLP

(57) ABSTRACT

Semiconductor devices, methods of manufacturing thereof, and image sensor devices are disclosed. In some embodiments, a semiconductor device includes a semiconductor chip comprising an array region, a periphery region, and a through-via disposed therein. A guard structure is disposed in the semiconductor chip between the array region and the through-via or between the through-via and a portion of the periphery region. A portion of the guard structure is disposed within a substrate of the semiconductor chip.

20 Claims, 9 Drawing Sheets

(56) References Cited

U.S. PATENT DOCUMENTS

2009/0206411 A1 8/2009 Koketsu et al.
2009/0224347 A1 9/2009 Kim et al.
2011/0163364 A1 7/2011 Kim et al.
2012/0205769 A1 8/2012 Tsai et al.
2013/0248862 A1 9/2013 Inoue et al.
2014/0131828 A1 5/2014 Isono et al.

SEMICONDUCTOR DEVICES, METHODS OF MANUFACTURING THEREOF, AND IMAGE SENSOR DEVICES

PRIORITY CLAIM AND CROSS-REFERENCE

This application is a continuation-in-part of, and claims the benefit of, U.S. patent application Ser. No. 14/063,953, filed on Oct. 25, 2013, titled "Semiconductor Devices, Methods of Manufacturing Thereof, and Image Sensor Devices," which is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, in other types of packaging, or used directly in an end application, for example.

Integrated circuit dies are typically formed on a front side of semiconductor wafers. The integrated circuit dies may comprise various electronic components, such as transistors, diodes, resistors, capacitors, and other devices. The integrated circuit dies may comprise various functions, such as logic memory, processors, and/or other functions.

Complementary metal oxide semiconductor (CMOS) image sensor (CIS) devices are semiconductor devices that are used in some cameras, cell phones, and other devices for capturing images. Back side illumination (BSI) image sensors are CIS devices in which light enters from a back side of a substrate, rather than the front side. BSI sensors are capable of capturing more of an image signal than front side illumination image sensors due to reduced reflection of light, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
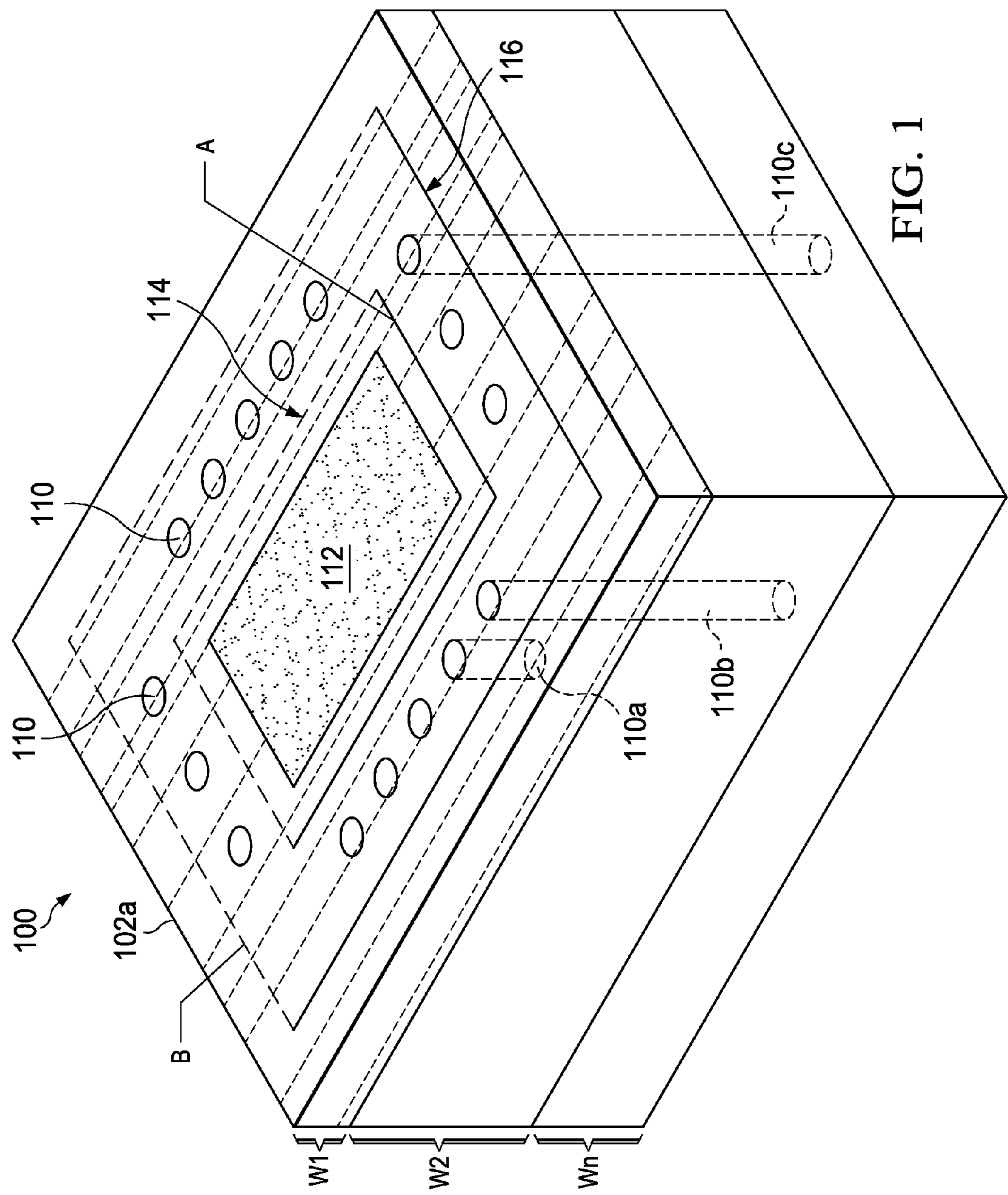
FIG. 1 is a perspective view illustrating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to semiconductor devices, manufacturing processes thereof, and image sensor devices. Novel guard structures and methods of formation thereof for semiconductor devices and image sensor devices will be described herein.

Figure 2:
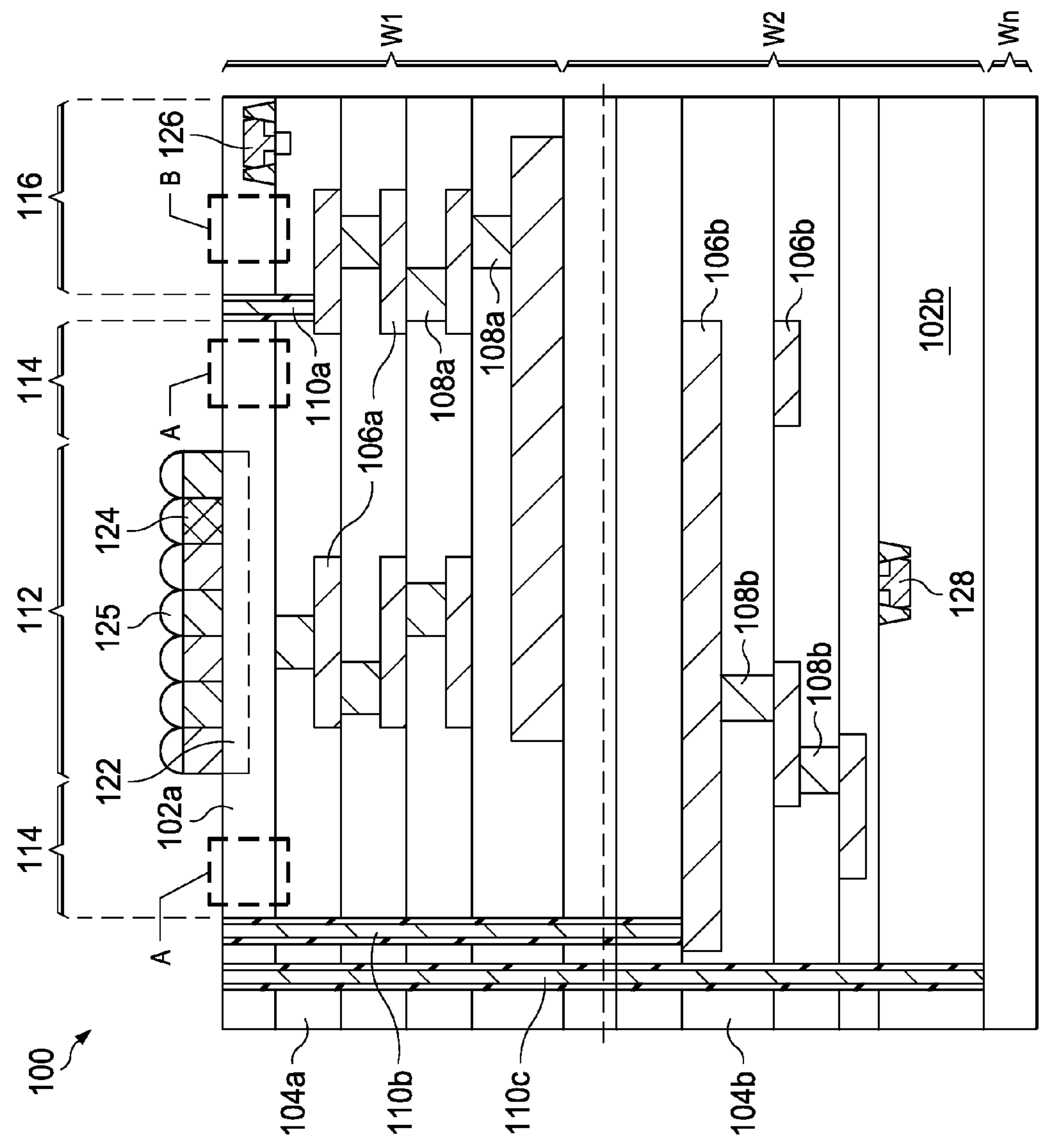
FIG. 2 is a cross-sectional view of a portion of the semiconductor device shown in FIG. 1 in accordance with some embodiments.

FIG. 1 is a perspective view illustrating a semiconductor device 100 in accordance with some embodiments of the present disclosure. FIG. 2 is a cross-sectional view of a portion of the semiconductor device 100 shown in FIG. 1 in accordance with some embodiments. The semiconductor device 100 includes three semiconductor chips W1, W2 and Wn bonded together. Semiconductor chip W1 comprises a first semiconductor chip that is bonded to a second semiconductor chip W2. A third semiconductor chip Wn is bonded to the second semiconductor chip W2. Only three semiconductor chips W1, W2 and Wn are shown in the drawings of the present disclosure; alternatively, the semiconductor device 100 may comprise a single semiconductor chip W1, two semiconductor chips W1, W2, or Wn, or four or more semiconductor chips, not shown.

The semiconductor chips W1, W2 and Wn may be bonded together using a suitable wafer bonding technique. Some examples of commonly used bonding techniques for wafer bonding include direct bonding, chemically activated bonding, plasma activated bonding, anodic bonding, eutectic bonding, glass frit bonding, adhesive bonding, thermo-compressive bonding, reactive bonding and/or the like. After the semiconductor chips or wafers W1, W2, and Wn are bonded together, the interface between each pair of adjacent semiconductor wafers W1, W2 and Wn may provide an electrically conductive path between the stacked semiconductor wafers W1, W2, and Wn. In accordance with some embodiments, in a direct bonding process, the connection between the adjacent semiconductor wafers W1, W2, and Wn can be implemented using metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof, and/or the like. In some embodiments, at least two of the adjacent semiconductor wafers W1, W2, and Wn are bonded together using a suitable metal-dielectric bonding technique such as a copper-silicon oxide nitride (Cu—SiON) bonding process, as another example.

One or more through-vias 110, 110*a*, 110*b*, and 110*c* may be formed within the semiconductor device 100 that provide vertical electrical connections for the semiconductor device 100. The semiconductor device 100 includes a plurality of through-vias 110, 110*a*, 110*b*, and 110*c* in accordance with some embodiments. Reference number 110 labels the through-vias generally, and reference numbers 110*a*, 110*b*, and 110*c* label the through-vias according to the depths that they extend within the semiconductor device 100. Through-vias 110*a* extend at least partially through the first semiconductor chip W1 and provide vertical electrical connections for the first semiconductor chip W1, e.g., from an upper layer to an underlying lower layer, or between the various material layers of the first semiconductor chip W1. Through-vias 110*b* extend through the first semiconductor chip W1 and at least partially through the second semiconductor chip W2, providing vertical electrical connections between the first semiconductor chip W1 and the second semiconductor chip W2. Through-vias 110*c* extend through the first semiconductor chip W1 and the second semiconductor chip Wn, and at least partially through the third semiconductor chip Wn, providing vertical electrical connections between the first semiconductor chip W1 and the third semiconductor chip Wn. Only three through-vias 110*a*, 110*b*, and 110*c* are shown extending through the first, second, and/or third semiconductor chips W1, W2 and Wn; however, alternatively, a plurality of the through-vias 110*a*, 110*b*, and 110*c* may extend through the first, second, and/or third semiconductor chips W1, W2 and Wn, as shown at 110 in FIG. 1, for example.

The first semiconductor chip W1 includes an array region 112, a periphery region 116, and at least one through-via 110, 110*a*, 110*b*, and 110*c* disposed therein. The first semiconductor chip W1 includes an intermediate region 114 disposed between the through-vias 110, 110*a*, 110*b*, and 110*c* and the array region 112, in accordance with some embodiments of the present disclosure.

The array region 112 includes a plurality of devices formed therein. In some embodiments, the plurality of devices in the array region 112 comprises a plurality of pixels, shown in FIG. 2, e.g., wherein the semiconductor device 100 comprises an image sensor device. The first semiconductor chip W1 comprises a pixel array wafer in some embodiments, for example. The array region 112 of the first semiconductor chip W1 comprises an array of pixels 122 in accordance with some embodiments, for example. In some embodiments, the first semiconductor chip W1 comprises a complementary metal oxide semiconductor (CMOS) image sensor (CIS) wafer or device, for example. The semiconductor device 100 comprises a stacked CMOS image sensor device in some embodiments, as another example.

FIG. 2 illustrates portions of the various regions of the first semiconductor chip W1 and the second semiconductor chip W2 in more detail. The first semiconductor chip W1 includes a substrate 102*a* and an inter-metal dielectric (IMD) 104*a* disposed over the substrate 102*a*. The substrate 102*a* may include a semiconductor substrate comprising silicon or other semiconductor materials and may be covered by an insulating layer, for example. The substrate 102*a* may also include other active components or circuits, not shown. The substrate 102*a* may comprise silicon oxide over single-crystal silicon, for example. Compound semiconductors, GaAs, InP, Si/Ge, or SiC, as examples, may be used in place of silicon. The substrate 102*a* may comprise a silicon-on-insulator (SOI) or a germanium-on-insulator (GOI) substrate, as examples. In embodiments wherein the first semiconductor chip W1 comprises a CIS wafer, the substrate 102*a* may include a variety of electrical circuits and/or devices. The electrical circuits formed on the substrate 102*a* may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. For example, in accordance with some embodiments, the first semiconductor chip W1 includes at least one periphery device 126 (see FIG. 2) in the periphery region 116. Only one periphery device 126 is shown in FIG. 2; alternatively, a plurality of periphery devices 126 may be formed in the periphery region 116 (see FIG. 7). The periphery device 126 comprises a transistor in the embodiment shown; alternatively, the periphery devices 126 may comprise other types of circuit elements.

The IMD 104*a* comprises a plurality of insulating material layers that include a plurality of conductive lines 106*a* and conductive vias 108*a* formed therein. The IMD 104*a*, conductive lines 106*a*, and conductive vias 108*a* provide electrical connections for the first semiconductor chip W1 in a horizontal and vertical direction. The insulating material layers of the IMD 104*a* may comprise silicon dioxide, silicon nitride, low dielectric constant (k) insulating materials having a dielectric constant or k value less than silicon dioxide (e.g., a k value of about 3.9 or less), extra-low k (ELK) dielectric materials having a k value of about 3.0 or less, or other types of materials, as examples. The conductive lines 106*a* and vias 108*b* may comprise materials such as Cu, Al, alloys thereof, seed layers, and/or barrier layers formed using damascene and/or subtractive etch processes, as examples. Alternatively, the IMD 104*a*, conductive lines 106*a*, and conductive vias 108*b* may comprise other materials and may be formed using other methods.

In some embodiments, the periphery region 116 is disposed around the array region 112, as shown in FIG. 1. For example, the array region 112 of the first semiconductor chip W1 may be located in a substantially central region of the first semiconductor chip W1, and the periphery region 116 may be disposed around a perimeter of the first semiconductor chip W1, around the array region 112. The through-vias 110, 110*a*, 110*b*, and 110*c* are disposed between the array region 112 and the periphery region 116. Alternatively, the arrangement of the array region 112, periphery region 116, and through vias 110, 110*a*, 110*b*, and 110*c* may comprise other shapes and configurations. As another example, the array region 112 may be located in one corner of the first semiconductor chip W1, and the periphery region 116 may be located in an L-shaped region proximate the array region 112.

In embodiments wherein the array region 112 includes an array of pixels, the pixel array 122 is formed within the substrate 102*a*, as shown in FIG. 2. In some embodiments, a color filter material 124 is formed over the array of pixels 122, and a lens material 125 is formed over the color filter material 124. The pixels in the pixel array 122 are adapted to sense images received by the pixel array 122. The color filter material 124 is adapted to separate light to a red-green-blue (R, G, or B) original element when the semiconductor device 100 is utilized as a back side illumination image sensor, for example. The color filter material 124 comprises a photosensitive material in some embodiments, as another example. The lens material 125 may comprise a micro-lens material in some embodiments, as an example. Alternatively, the color filter material 124 and the lens material 125 may comprise other materials. In some embodiments, the color filter material 124 and/or the lens material 125 are not included, and the array region 112 may include other types of devices than pixels.

The second semiconductor chip W2 includes a substrate 102*b* that includes a plurality of devices 128 formed therein. The substrate 102*b* may include similar materials and devices as described for the substrate 102*a* of the first semiconductor chip W1, for example. The second semiconductor chip W2 includes an IMD 104*b*, a plurality of conductive lines 106*b*, and a plurality of conductive vias 108*b* disposed over the substrate 102*b*, that comprise similar materials as described for the first semiconductor chip W1. The first semiconductor chip W1 is inverted before bonding the first semiconductor chip W1 to the second semiconductor chip W2, as illustrated in FIG. 2, in some embodiments.

The third semiconductor chip Wn comprises similar materials as described for the first and second semiconductor chips W1 and W2, such as a substrate, various circuits and/or devices formed thereon, and an IMD, conductive lines, and vias, not shown, in some embodiments.

In accordance with some embodiments of the present disclosure, a guard structure (not shown in FIGS. 1 and 2; see guard structures 130 shown in FIGS. 3 and 4) is disposed in the first semiconductor chip W1 between the array region 112 and one of the through-vias 110, 110*a*, 110*b*, and/or 110*c* (e.g., in the intermediate region 114), or between one of the through-vias 110, 110*a*, 110*b*, and/or 110*c* and a portion of the periphery region 116. In some embodiments, a guard structure 130 is included in the first semiconductor chip W1 between both the array region 112 and one of the through-vias 110, 110*a*, 110*b*, and/or 110*c* and also between one of the through-vias 110, 110*a*, 110*b*, and/or 110*c* and a portion of the periphery region 116. In some embodiments, a guard structure 130 is disposed in the first semiconductor chip W1 between the array region 112 and one of the through-vias 110, 110*a*, 110*b*, and/or 110*c* (e.g., in the intermediate region 114), and/or between one of the through-vias 110, 110*a*, 110*b*, and/or 110*c* and a periphery device 126 in the periphery region 116.

For example, in FIGS. 1 and 2, regions A illustrate regions where a guard structure 130 is formed in the first semiconductor chip W1 between the array region 112 and one of the through-vias 110*a*, 110*b*, and/or 110*c* in the intermediate region 114. Region B illustrates a region where a guard structure 130 is formed in the first semiconductor chip W1 between one of the through-vias 110*a*, 110*b*, and/or 110*c* and a portion of the periphery region 116 or a periphery device 126 in the periphery region 116.

Figure 3:
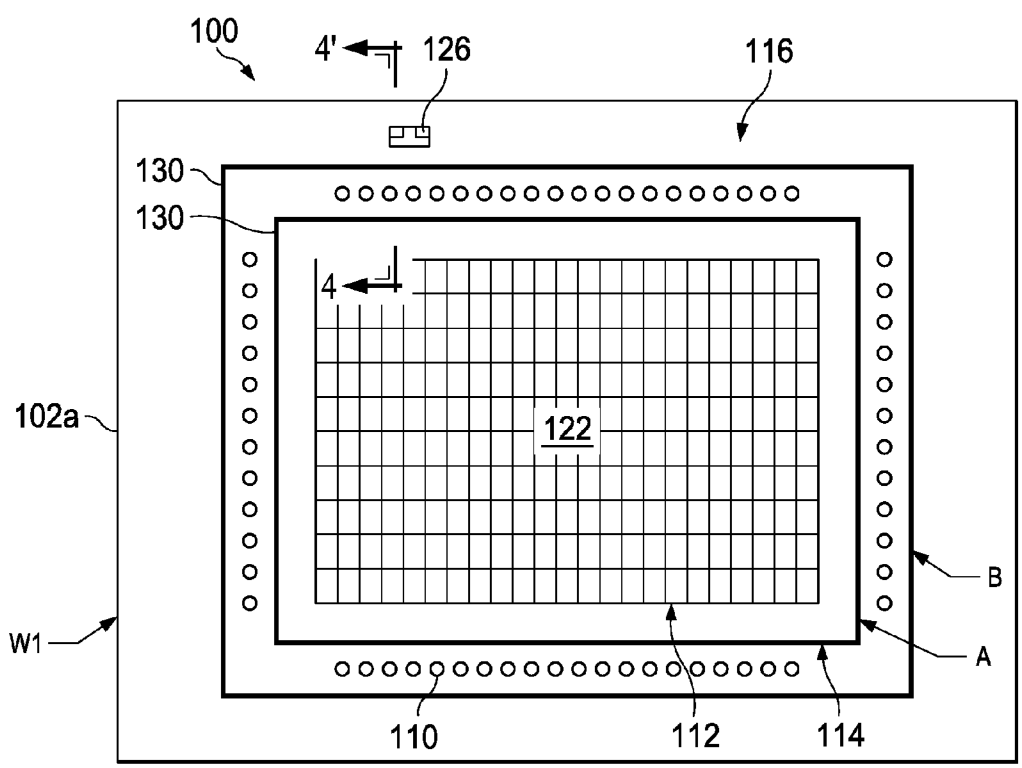
FIG. 3 is a top view that illustrates a guard structure disposed within a semiconductor device in accordance with some embodiments.

FIG. 3 is a top view of a semiconductor device 100 which illustrates a guard structure 130 disposed within the semiconductor device 100 in accordance with some embodiments. In some embodiments, the guard structure 130 comprises two or more portions (e.g., two portions are shown in FIG. 3), which portions are also referred to herein as guard structures 130. The guard structures 130 substantially comprise a shape in the top view of the first semiconductor chip W1 of the semiconductor device 100 of a rectangle in the embodiments shown. The guard structures 130 may also substantially comprise a shape in the top view of a square, e.g., in embodiments wherein the semiconductor device 100 is substantially square or other shapes. The guard structures 130 comprise rings of continuous material (or non-continuous in other embodiments, to be described further herein with reference to FIG. 5) around predetermined regions of the semiconductor device 100, in some embodiments. The two portions of the guard structure 130 shown in FIG. 3 include a first guard structure 130 disposed around the array region 112 including the pixel array 122 between the array region 112 and the through-vias 110; and a second guard structure 130 disposed around the through-vias 110 and the array region 112 between the through vias 110 and the periphery device 126 in the periphery region 116. Alternatively, the guard structure 130 may comprise one portion, or three or more portions.

Figure 4:
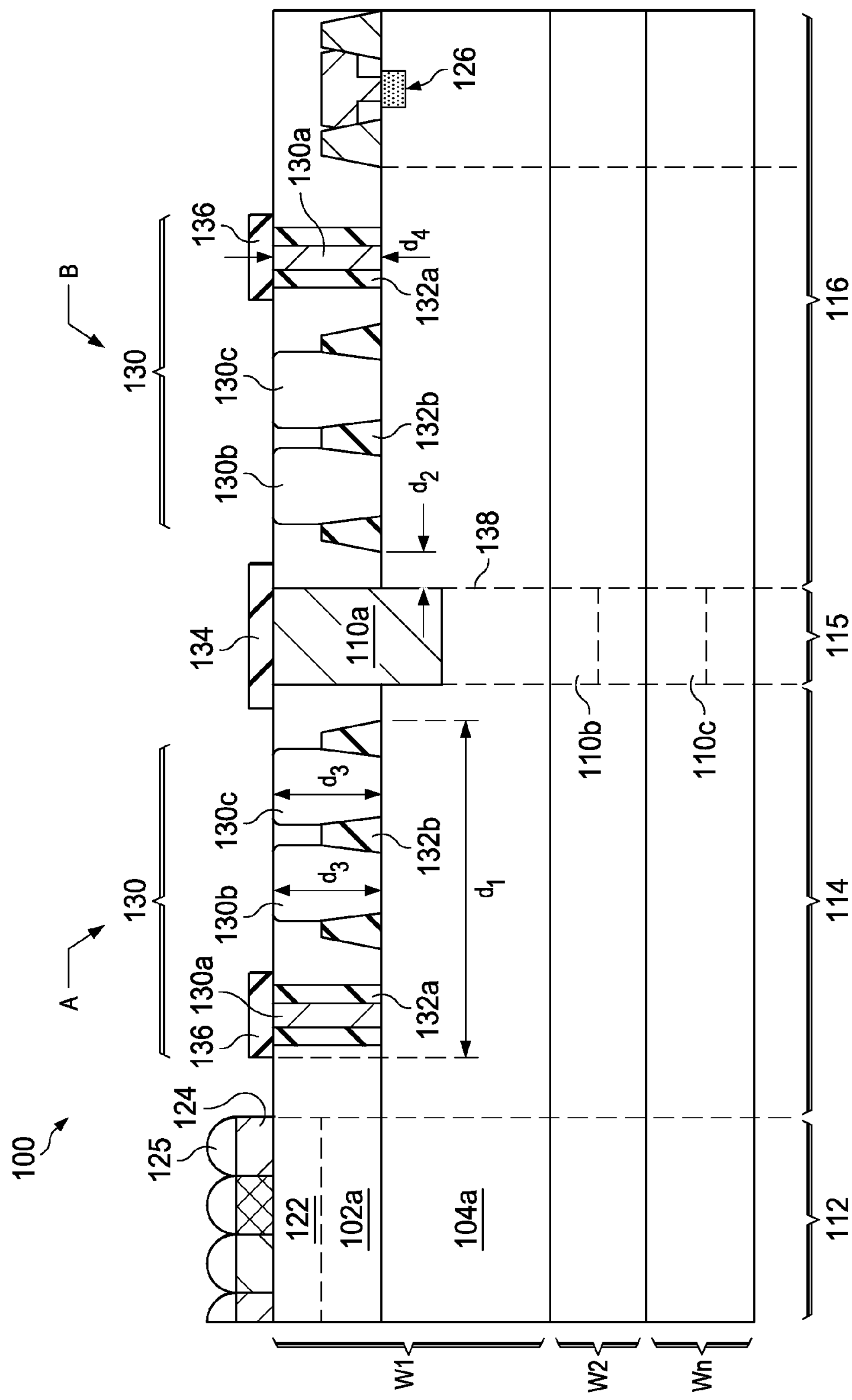
FIG. 4 is a cross-sectional view of a portion of the semiconductor device shown in FIG. 3 in accordance with some embodiments.

FIG. 4 is a cross-sectional view of a portion of the semiconductor device 100 shown in FIG. 3, at view 4-4' of FIG. 3 in accordance with some embodiments. More detailed views of the guard structure 130 in region A and the guard structure 130 in region B in accordance with some embodiments are illustrated in FIG. 4. The guard structures 130 may each comprise a metal feature 130*a*, a P-type region 130*b*, an N-type region 130*c*, or a combination thereof, in some embodiments. In some embodiments, the guard structures 130 may comprise only a metal feature 130*a*, only an N-type region 130*c*, only a P-type region 130*b*, or a combination of two or more thereof, for example. The guard structures 130 may comprise a plurality of the metal features 130*a*, a plurality of the P-type regions 130*b*, a plurality of the N-type regions 130*c*, or a combination thereof, in other embodiments.

In embodiments wherein the guard structure or structures 130 include a metal feature 130*a*, the guard structure 130 may comprise a trench formed within the substrate 102*a* of the first semiconductor chip W1. The metal feature 130*a* comprises a conductive material disposed within the trench. The conductive material of the metal feature 130*a* may comprise W, Cu, AlCu, other conductive materials, and/or combinations thereof, as examples.

The trench of the guard structure 130 comprising the metal feature 130*a* may be formed in some embodiments using a lithography process, by forming a layer of photoresist (not shown) over the substrate 102*a*, patterning the layer of photoresist by exposing the layer of photoresist to energy reflected from or transmitted through a lithography mask (also not shown) having a desired pattern thereon, developing the layer of photoresist, and removing exposed or unexposed portions of the layer of photoresist (depending on whether the photoresist comprises a positive or negative photoresist) using an ashing and/or etch process. The layer of photoresist is then used as an etch mask while portions of the substrate 102*a* are etched away using an etch process. The patterning process for the substrate 102*a* of the first semiconductor chip W1 may be performed before or after the first semiconductor chip W1 is bonded to another semiconductor chip, for example. Alternatively, the trenches for the metal features 110*a* may be formed using a direct patterning, laser drilling, or other type of process.

After the trenches are formed in the substrate 102*a*, the trenches are filled with a material. Filling the trenches with the material comprises filling the trenches with an insulating material, a conductive material, or a combination thereof in some embodiments. For example, in FIG. 4, the trenches are first lined with an insulating material 132*a* before forming the conductive material of the conductive features 110*a*. The insulating material 132*a* comprises about 1 nm to about 20 μm of silicon dioxide, silicon nitride (SiN), silicon oxynitride (SiON), a carbon-containing layer such as SiC, tantalum pentoxide ($Ta_2O_5$), aluminum oxide ($Al_2O_3$), hafnium oxide ($HfO_2$), other insulating materials, or combinations or multiple layers thereof in some embodiments. In other embodiments, an insulating material 132*a* is not formed in the trenches. The conductive material of the metal feature 130*a* is then formed within the trenches over the insulating material 132*a*, or directly into the trenches if the insulating material 132*a* is not included. The conductive material may be formed using a sputtering process, electro-chemical plating (ECP), physical vapor deposition (PVD), or other methods, for example. Excess conductive material may be removed from over a top surface of the substrate 102*a* using a chemical-mechanical polishing (CMP) process, an etch process, or a combination thereof, for example. A barrier 136 may be disposed over a top surface of the metal features 130*a*, also shown in FIG. 4. The barrier 136 comprises a material such as an insulator that is adapted to prevent out-diffusion of a conductive material of the metal feature 130*a*, preventing contamination in some embodiments, for example. In other embodiments, the barrier 136 is not included.

In FIG. 4, a through-via 110*a* formed within the first semiconductor chip W1 is shown. A through-via 110*b* formed within the first semiconductor chip W1 and that also extends into the second semiconductor chip W2 is shown in phantom (e.g., in dashed lines). A through-via 110*b* formed within the first semiconductor chip W1 and that extends through the second semiconductor chip W2 and into the third semiconductor chip Wn is also shown in phantom.

The through-vias 110*a*, 110*b*, and 110*c* may be formed in the semiconductor device 100 after the bonding process for the semiconductor chips W1, W2, and Wn, in some embodiments. Trenches for the through-vias 110*a*, 110*b*, and 110*c* can be formed after the bonding process and then filled with a conductive material, such as W, Cu, AlCu, other conductive materials, and/or combinations or multiple layers thereof, as examples. The trenches are lined with about 0.5 μm to about 20 μm of an insulating material 138 such as silicon dioxide, SiN, SiON, a carbon-containing layer such as SiC, $Ta_2O_5$, $Al_2O_3$, $HfO_2$, other insulators, or combinations or multiple layers thereof in some embodiments, before forming the conductive material of the through-vias 110*a*, 110*b*, and 110*c*.

In other embodiments, portions of the through-vias 110*a*, 110*b*, and 110*c* may be formed before the bonding process during the manufacturing process of each of the semiconductor chips W1, W2, and Wn. The portions of the through-vias 110*a*, 110*b*, and 110*c* are positioned so that they align after the bonding process for the semiconductor chips W1, W2, and Wn in these embodiments, for example.

In embodiments wherein the guard structure or structures 130 include an N-type region 130*c* or a P-type region 130*b*, the guard structure or structures 130 may be formed by implanting the substrate 102*a* of the first semiconductor chip W1 and/or epitaxially growing a material with a trench formed in the substrate 102*a* to form a P-type material, an N-type material, or a combination thereof, for example, in accordance with some embodiments. The substrate 102*a* of the first semiconductor chip W1 may be implanted with a dopant such as B, As, or P; or SiGe or SiC implanted with B, As, or P, may be epitaxially grown in the trenches formed in the substrate 102*a* to form the guard structures 130 comprising the N-type regions 130*c* or the P-type regions 130*b*, as examples. Alternatively, the N-type regions 130*c* and the P-type regions 130*b* may be formed using other methods.

An insulating material 132*b* may be included in the first semiconductor chip W1 proximate the N-type regions 130*c* or the P-type regions 130*b*, also shown in FIG. 4. The insulating material 132*b* may comprise shallow trench isolation (STI) regions, in some embodiments. A contact (not shown) may also be disposed over a top surface of the N-type regions 130*c* or the P-type regions 130*b*, as illustrated for the guard structures 130 comprising the metal features 130*a*. In some embodiments, at least portions of the N-type regions 130*c* or the P-type regions 130*b* may be formed during the manufacturing process of other devices of the first semiconductor chip W1, such as the periphery devices 126, for example. Alternatively, additional processing steps can be included to form the N-type regions 130*c* or the P-type regions 130*b*.

In some embodiments, the guard structure or structures 130 comprise a width comprising dimension $d_1$ in the cross-sectional view shown in FIG. 4, wherein dimension $d_1$ comprises about 0.01 μm or greater, in some embodiments. The guard structure or structures 130 are spaced apart from the through-via 110*a*, 110*b*, or 110*c* by a dimension $d_2$ that comprises about 0.1 μm or greater, in some embodiments. The guard structure or structures 130 are formed at a depth of dimension $d_3$ or $d_4$ that comprises about 0.01 μm to about 100 μm below a surface of the first semiconductor chip W1, in some embodiments. In embodiments wherein the guard structures 130 comprise an N-type region 130*c* or a P-type region 130*b*, dimension $d_3$ comprises about 0.01 μm to about 20 μm below a surface of the first semiconductor chip W1, as another example.

In some embodiments, a voltage may be applied during the operation of the semiconductor device 100 to the guard structure or structures 130. For example, in embodiments wherein the guard structure 130 comprises a metal feature 130*a*, a voltage of about −10 Volts (V) to about 10 V may be applied to the metal feature 130*a* during the operation of the semiconductor device 100. In embodiments wherein the guard structure 130 comprises a P-type region 130*b*, a voltage of about 0 V to about −10 V may be applied to the P-type region 130*b* during the operation of the semiconductor device 100. In embodiments wherein the guard structure 130 comprises an N-type region 130*c*, a voltage of about 0.1 V to about 10 V may be applied to the N-type region 130*c* during the operation of the semiconductor device 100. Alternatively, other voltage levels may be applied to the ground structures 130 during the operation of the semiconductor devices 100 described herein. Applying the voltage to the guard structure 130 improves noise reduction of the guard structures 130 in some embodiments, for example. In other embodiments, a voltage may not be applied.

Two guard structures 130 are shown in FIGS. 3 and 4; alternatively, one, two, or three or more guard structures 130 may be included in a semiconductor device 100 in accordance with some embodiments.

Figure 5:
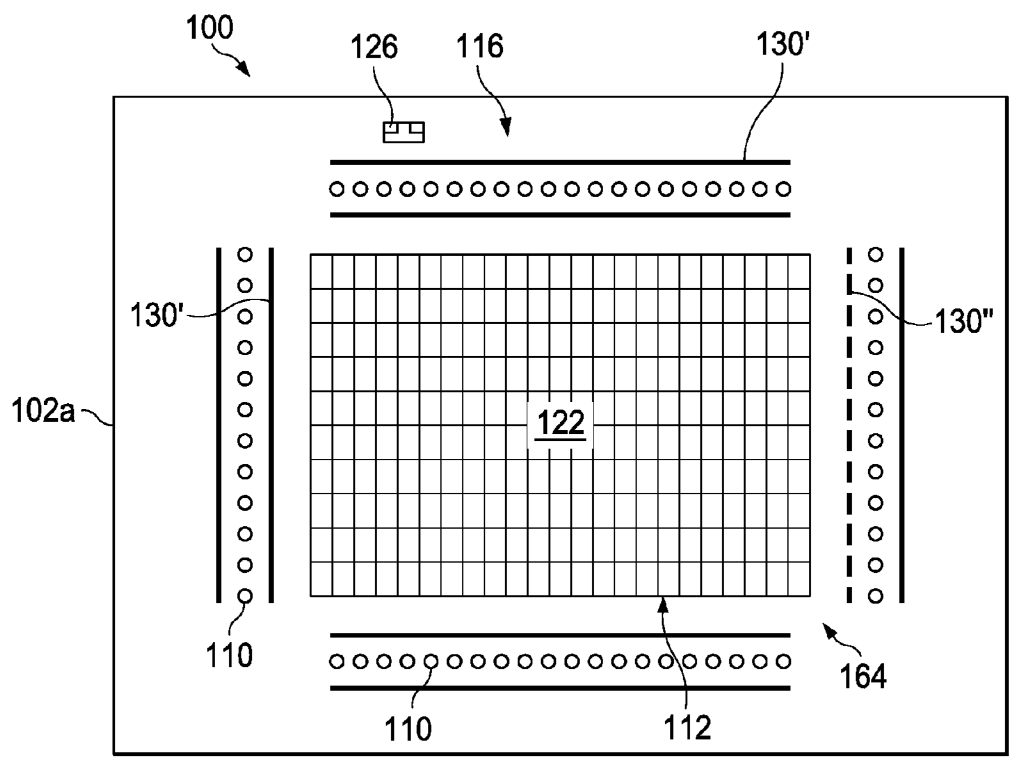
FIGS. 5 through 7 are top views of semiconductor devices that illustrate various shapes and configurations of guard structures for semiconductor devices in accordance with some embodiments.
Figure 6:
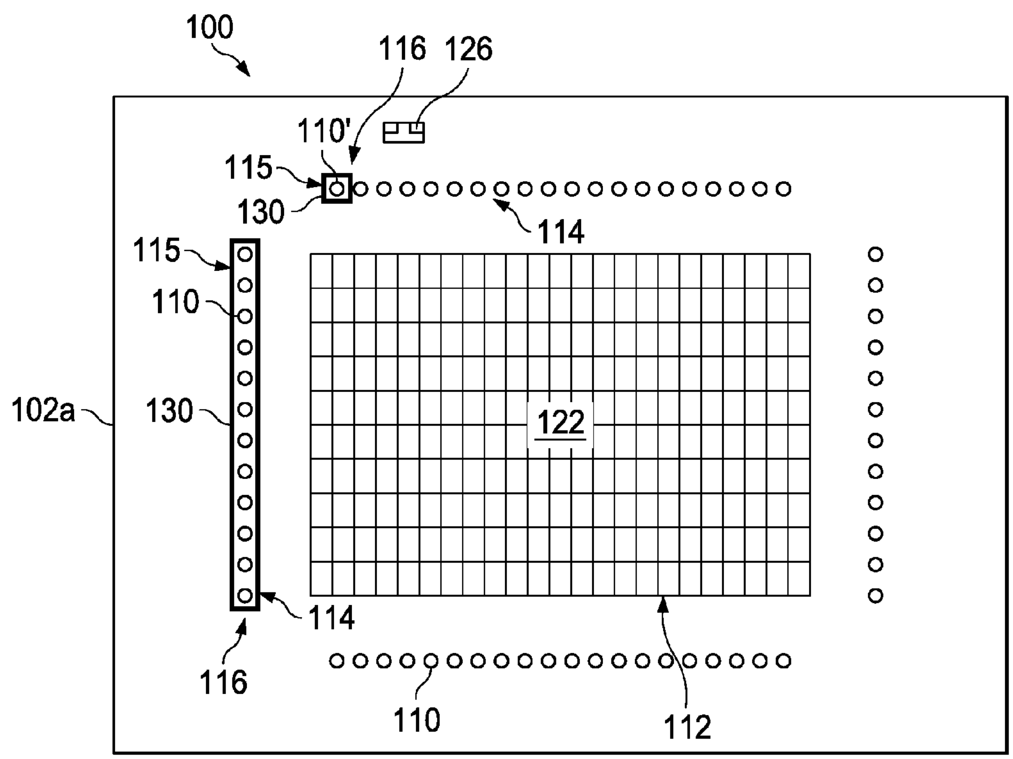
Figure 7:
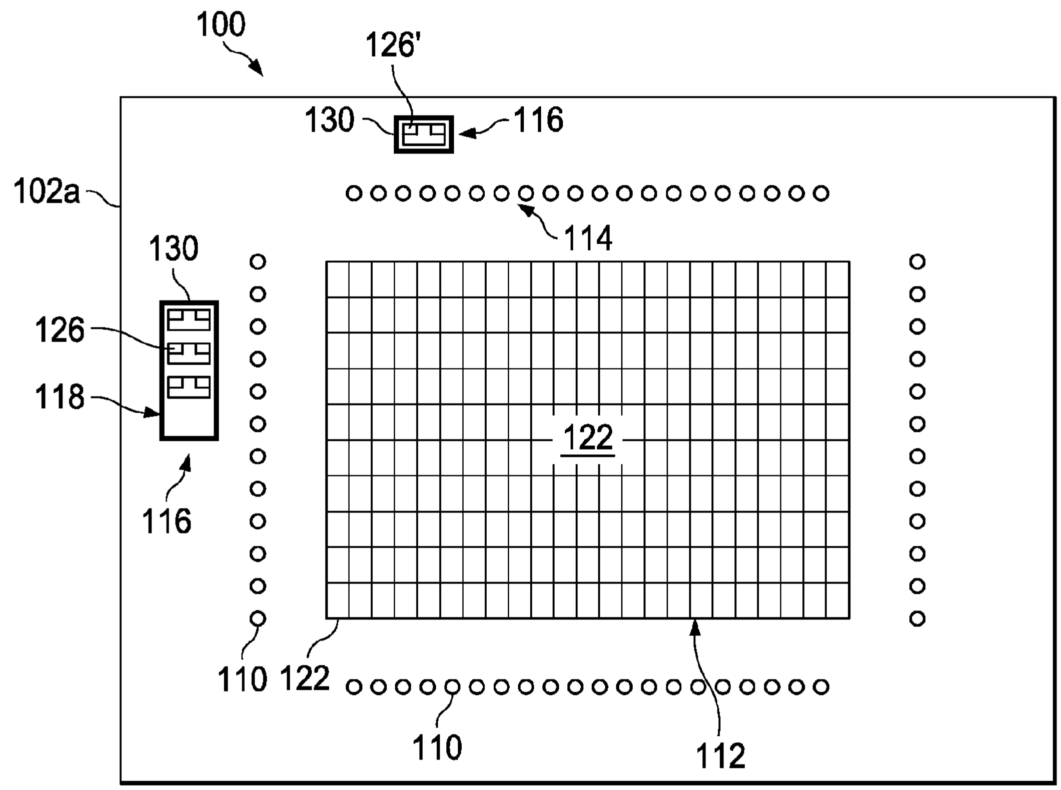

FIGS. 5 through 7 are top views of semiconductor devices 100 that illustrate various shapes and configurations of guard structures 130, 130' and 130" for semiconductor devices 100 in accordance with some embodiments. In accordance with some embodiments, the guard structures 130 may substantially comprise a shape in a top view of the first semiconductor chip W1 of a square or a rectangle (i.e., the embodiments shown in FIG. 3 and previously described herein, and in the embodiments shown in FIGS. 6 and 7). In other embodiments, the guard structures 130' and 130" may substantially comprise a shape in a top view of the first semiconductor chip W1 of a continuous bar, a plurality of continuous bars, a non-continuous bar, or a plurality of non-continuous bars (i.e., the embodiments shown in FIG. 5). In yet other embodiments, the guard structures 130, 130', and 130" may comprise combinations of the various shapes described herein.

In some embodiments, the guard structures 130 may be disposed proximate or around the array region 112 (i.e., the embodiments shown in FIGS. 3 and 5), disposed proximate or around the plurality of through-vias 110 (i.e., the embodiments shown in FIGS. 3, 5, 6, and 7), disposed proximate or around the plurality of through-vias 110 and the array region (i.e., the embodiments shown in FIGS. 3 and 5), disposed proximate or around one of the plurality of through-vias 110 (i.e., the embodiments shown in FIG. 6), disposed proximate or around a group of the plurality of through-vias 110 (i.e., the embodiments shown in FIG. 6), disposed proximate or around one of the plurality of periphery devices 126 (i.e., the embodiments shown in FIG. 7), disposed proximate or around a group of the plurality of periphery devices 126 (i.e., the embodiments shown in FIG. 7), or a combination thereof.

In FIG. 5, guard structures 130' substantially comprising a shape of a continuous bar are disposed proximate the through-vias 110. For example, the guard structures 130' extend along a row of the through-vias 110 along each side of the semiconductor device 100. The semiconductor device 100 includes guard structures 130' comprising a plurality of continuous bars, for example. The guard structures 130' are disposed either between the through-vias 110 and the array region 112, or between the through-vias 110 and the periphery region 116, or both. All or some of the guard structures of a semiconductor device 100 may comprise a guard structure 130' substantially having a shape of a continuous bar, in accordance with some embodiments.

Guard structure 130" substantially comprising a shape of a plurality of non-continuous bars are disposed proximate a group of the plurality of through-vias 110. For example, the guard structures 130" extends along a row of the through-vias 110 along each one side of the semiconductor device 100, and the guard structures 130" are disposed between the through-vias 110 and the array region 112 in the embodiment shown in FIG. 5. In other embodiments, the guard structures 130" may be disposed either between the through-vias 110 and the array region 112, between the through-vias 110 and the periphery region 116, or both (not shown). All or some of the guard structures of a semiconductor device 100 may comprise a guard structure 130" substantially comprising a shape of a plurality of non-continuous bars, in accordance with some embodiments.

FIG. 6 illustrates some embodiments of the present disclosure wherein a guard structure 130 is disposed around a group of the plurality of through-vias 110, as shown along the left side of the semiconductor device 100. The guard structure 130 substantially comprises a shape of a rectangle in the top view. A portion of the guard structure 130 is disposed between the through-vias 110 and the array region 112, and a portion of the guard structure 130 is disposed between the through-vias 110 and the periphery region 116. All or some of the guard structures of a semiconductor device 100 may comprise a guard structure 130 substantially comprising a rectangular shape that is disposed around a group of the through-vias 110, in accordance with some embodiments.

FIG. 6 also illustrates some embodiments of the present disclosure wherein a guard structure 130 is disposed around one of the plurality of through-vias 110', as shown at the top side of the semiconductor device 100. The guard structure 130 substantially comprises a shape of a square in the top view. A portion of the guard structure 130 is disposed between the through-vias 110 and the array region 112, and a portion of the guard structure 130 is disposed between the through-vias 110 and the periphery region 116. All or some of the guard structures 130 of a semiconductor device 100 may comprise a guard structure 130 having a substantially square shape that is disposed around one or all of the through-vias 110, in accordance with some embodiments.

FIG. 7 illustrates some embodiments of the present disclosure wherein a guard structure 130 is disposed around a group of the plurality of periphery devices 126, as shown along the left side of the semiconductor device 100. The guard structure 130 substantially comprises a shape of a rectangle in the top view. A portion of the guard structure 130 is disposed between the through-vias 110 and the array region 112, and a portion of the guard structure 130 is disposed between the through-vias 110 and the periphery devices 126 in the periphery region 116. All or some of the guard structures of a semiconductor device 100 may comprise a guard structure 130 having a substantially rectangular shape that is disposed around a group of the periphery devices 126, in accordance with some embodiments.

FIG. 7 also illustrates some embodiments of the present disclosure wherein a guard structure 130 is disposed around one of the periphery devices 126', as shown along the top side of the semiconductor device 100. The guard structure 130 substantially comprises a shape of a square in the top view. A portion of the guard structure 130 is disposed between the through-vias 110 and the array region 112, and a portion of the guard structure 130 is disposed between the through-vias 110 and the periphery device 126 in the periphery region 116. All or some of the guard structures 130 of a semiconductor device 100 may comprise a guard structure 130 having a substantially square shape that is disposed around one or all of the periphery devices 126, in accordance with some embodiments.

In the embodiments shown in FIG. 6, the guard structures 130 may alternatively comprise a continuous bar, a plurality of continuous bars, a non-continuous bar, a plurality of non-continuous bars, and/or combinations thereof (i.e., as shown in FIG. 5), disposed proximate or around a group of the through-vias 110 or one of the through-vias 110'. Likewise, In the embodiments shown in FIG. 7, the guard structures 130 may alternatively comprise a continuous bar, a plurality of continuous bars, a non-continuous bar, a plurality of non-continuous bars, and/or combinations thereof (i.e., as shown in FIG. 5), disposed proximate or around a group of the periphery devices 126 or one of the periphery devices 126'.

Furthermore, a guard structure of a semiconductor device 100 may comprise one or more of the novel guard structures 130, 130', and 130" positioned in the locations described on the semiconductor device 100 herein in accordance with some embodiments, for example.

Referring again to FIG. 4, some examples of combinations of the metal features **130*a*, P-type regions 130*b*, and N-type regions 130*c* that may be used to form the guard structures 130, 130', and 130" described herein may comprise: a first P-type region 130*b*, an N-type 130*c* region adjacent the first P-type region 130*b*, and a second P-type region 130*b* adjacent the N-type region 130*c*; a first metal feature 130*a*, a first P-type region 130*b* proximate the first metal feature 130*a*, an N-type 130*c* region adjacent the first P-type region 130*b*, a second P-type region 130***b* adjacent the N-type region 130*c*, and a second metal feature 130*a* proximate the second P-type region 130*b*; or an N-type region 130*c*, P-type region 130*b* adjacent the N-type region 130*c*, and a metal feature 130*a* proximate the P-type region 130*b*, as examples. Alternatively, the metal features 130*a*, P-type regions 130*b*, and N-type regions 130*c* may be combined in other configurations to form the guard structures 130, 130', and 130" described herein.

Figure 8:
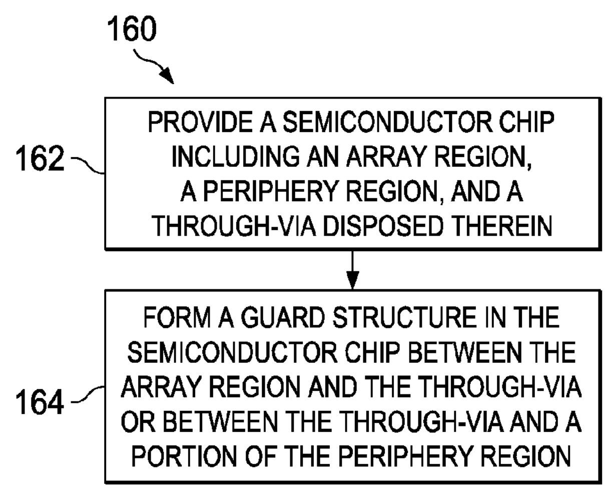
FIG. 8 is a flow chart showing a method of manufacturing a semiconductor device in accordance with some embodiments.

FIG. 8 is a flow chart 160 showing a method of manufacturing a semiconductor device 100 in accordance with some embodiments. In step 162, a semiconductor chip W1 is provided (see also FIG. 1) that includes an array region 112, a periphery region 116, and a through-via 110*a* disposed therein. In step 164, a guard structure 130 is formed in the semiconductor chip W1 between the array region 112 and the through via 110*a* or between the through-via 110*a* and a portion of the periphery region 116 (see FIG. 3).

Some embodiments of the present disclosure include manufacturing methods for semiconductor devices 100, and also include semiconductor devices 100 manufactured using the methods and that include the novel guard structures 130, 130', and 130" described herein. Some embodiments of the present disclosure also include image sensor devices that include the guard structures 130, 130', and 130" described herein.

In some embodiments, the image sensor devices comprise stacked complementary metal oxide semiconductor (CMOS) back side illumination (BSI) image sensor devices, for example. Referring again to FIG. 1, a top surface of the first semiconductor chip W1 comprises a back side of the semiconductor device 100, in some embodiments. The through-vias 110 extend from the back side surface through at least a portion of the first semiconductor chip W1 in these embodiments, for example. The guard structures 130 described herein extend from the back side surface fully through the substrate 102*a* of the first semiconductor chip W1, as shown in FIG. 4, in accordance with some embodiments.

Advantages of some embodiments of the disclosure include providing novel guard structures 130, 130' and 130" that improve performance of semiconductor devices and image sensor devices. The guard structures 130, 130', and 130" comprise continuous or non-continuous rings of conductive or semiconductive material that reduce or improve phenomena of dark current, white pixels, and noise that can occur in some image sensor applications and other semiconductor device applications, in some embodiments, for example. The guard structures 130, 130', and 130" reduce through-via 110 process charging build-up caused by grounding paths, noise, and tensor or compressive stress. A voltage may be applied to the guard structure 130, 130', and 130" to further reduce noise, in some applications. In other applications, a voltage may not be applied to the guard structures 130, 130', and 130". In embodiments wherein the guard structures 130, 130', and 130" include metal features 130*a*, RF noise is reduced in some embodiments, due to a shielding effect provided by the novel guard structures 130, 130', and 130", for example. Furthermore, the novel guard structures 130, 130', and 130" and designs are easily implementable in manufacturing process flows.

In accordance with some embodiments of the present disclosure, a semiconductor device includes a semiconductor chip including an array region, a periphery region, and a through-via disposed therein. The semiconductor device includes a guard structure disposed in the semiconductor chip between the array region and the through-via or between the through-via and a portion of the periphery region.

In accordance with other embodiments, a method of manufacturing a semiconductor device includes providing a semiconductor chip including an array region, a periphery region, and a through-via disposed therein, and forming a guard structure in the semiconductor chip between the array region and the through-via or between the through-via and a portion of the periphery region.

In accordance with other embodiments, an image sensor device includes a first semiconductor chip including an array region, a periphery region disposed around the array region, and a first through-via disposed between the array region and the periphery region. The image sensor device includes a second semiconductor chip bonded to the first semiconductor chip. The second semiconductor chip includes a second through-via disposed therein, the second through-via also being disposed in the first semiconductor chip. A guard structure is disposed in the first semiconductor chip between the array region and the first through-via or the second through-via, or between a portion of the periphery region and the first through-via or the second through-via.

Figure 9:
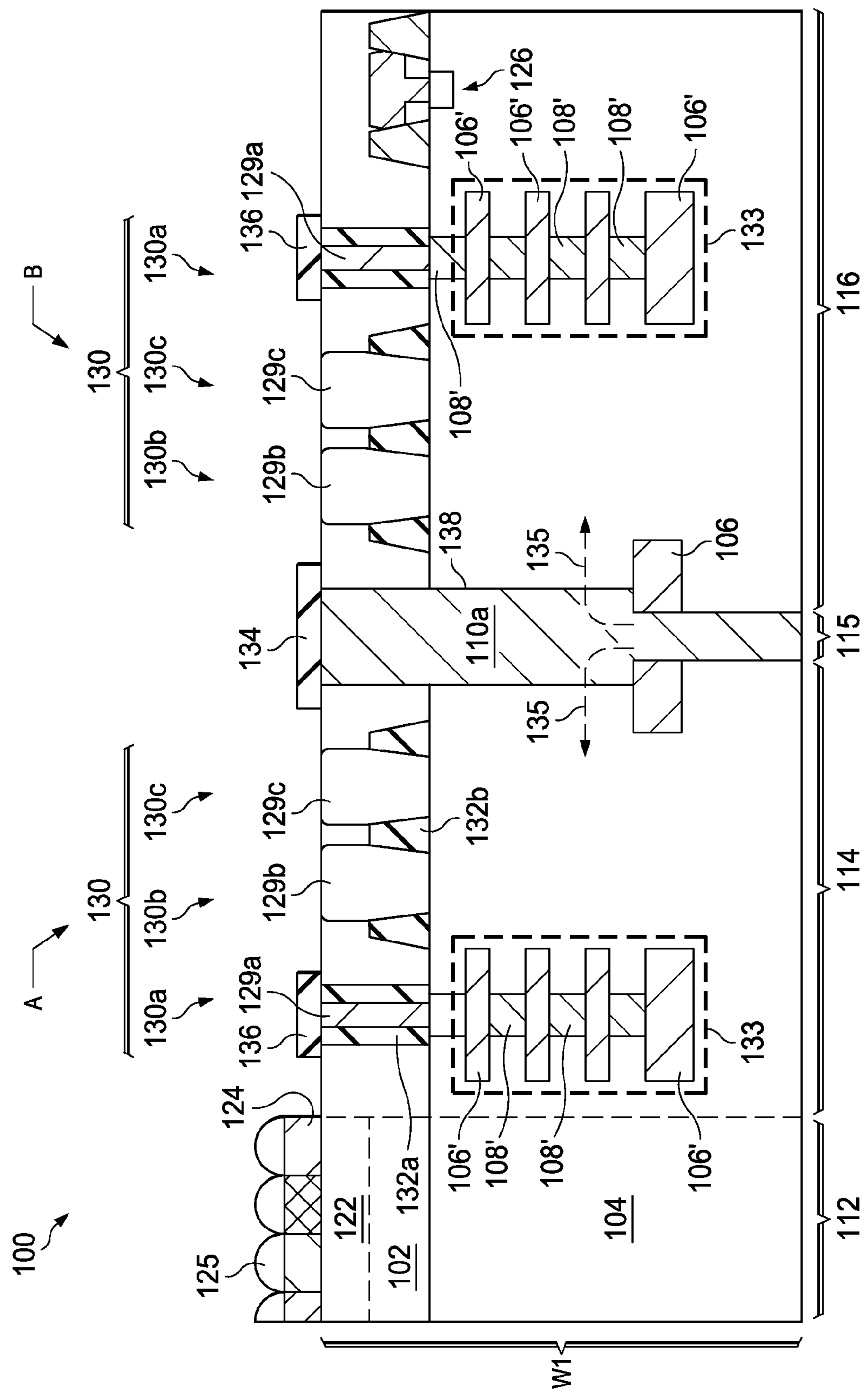
FIGS. 9, 10, and 11 are cross-sectional views of a portion of a semiconductor device in accordance with some embodiments, wherein guard structures include a stack of conductive vias or conductive via bars and conductive lines or conductive line segments.
Figure 10:
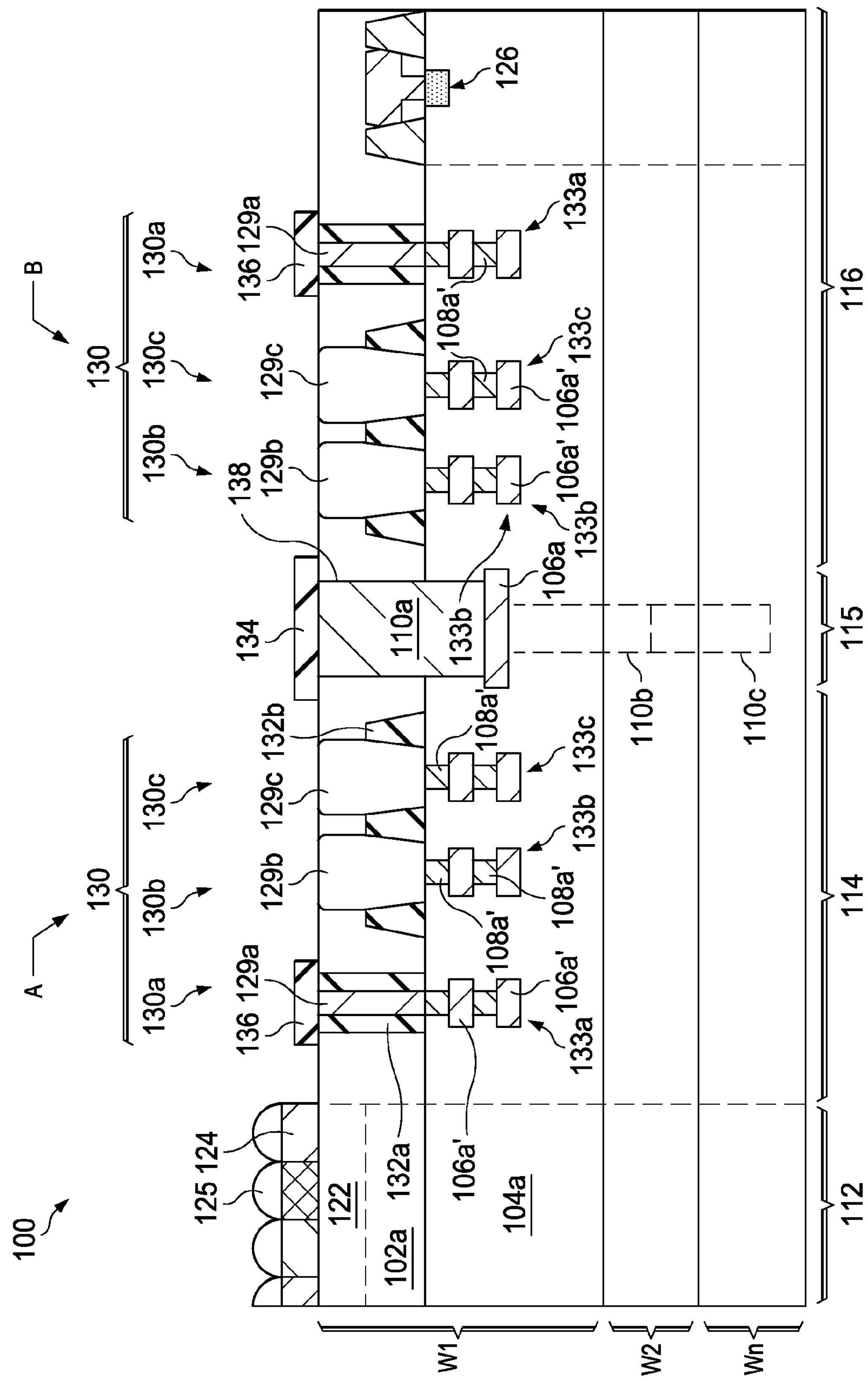
Figure 11:
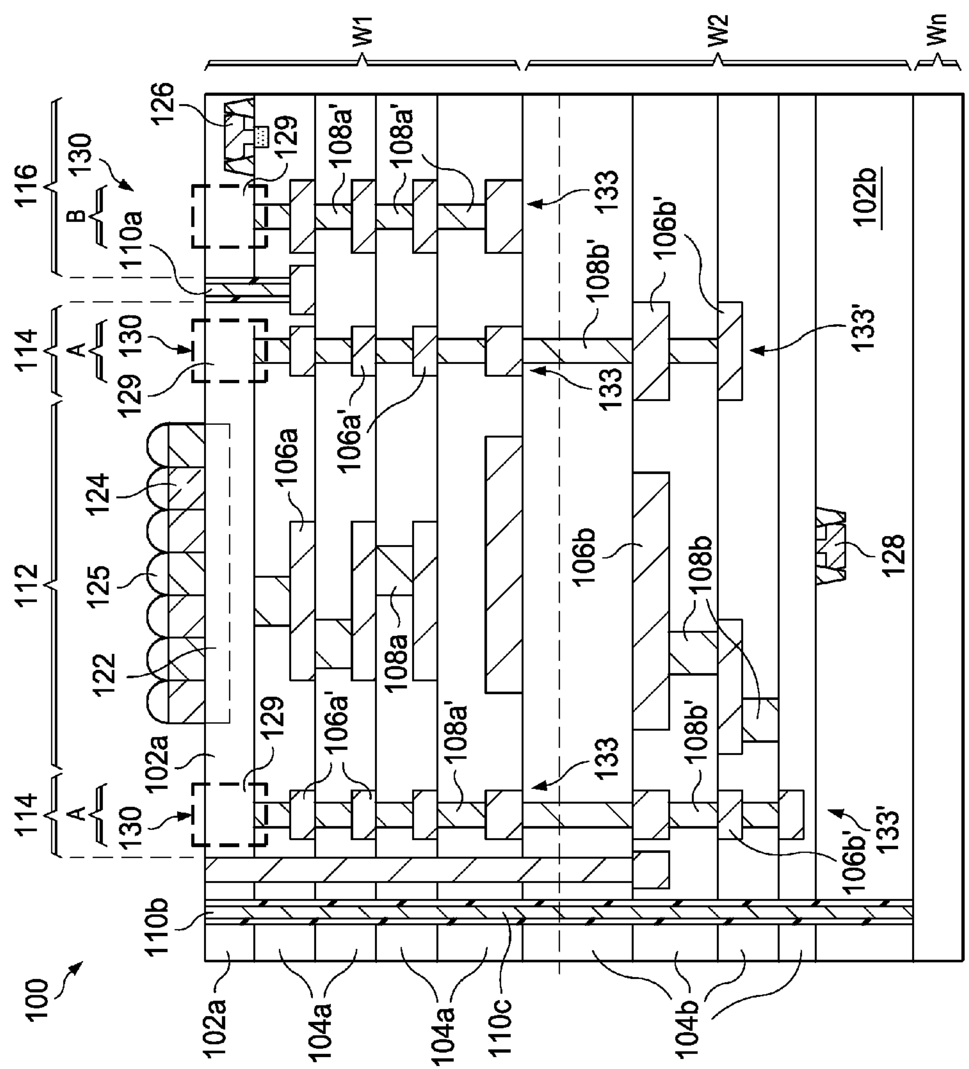

FIGS. 9, 10, and 11 are cross-sectional views of a portion of a semiconductor device 100 in accordance with some embodiments of the present disclosure, wherein guard structures 130 include a stack of conductive vias and/or conductive via bars 108', 108*a*', 108*b*' and conductive lines and/or conductive line segments 106', 106*a*', 106*b*'. In FIG. 9, a first semiconductor chip W1 is shown that includes an array region 112, a periphery region 116, and a through-via 110*a* disposed therein. The through-via 110*a* is formed in a through-via region 115. A guard structure 130 is formed in region A which comprises an intermediate region 114 disposed between the array region 112 and the through-via 110*a* in the through-via region 115. A guard structure 130 is also formed in region B which is between the through-via 110*a* and a portion of the periphery region 116, i.e., a portion of the periphery region 116 comprising a periphery device 126.

In FIG. 9, the guard structures 130 include three regions 130*a*, 130*b*, and 130*c*, as shown and described for FIG. 4. The guard structures 130 may each comprise a first portion 129*a* comprising a metal feature 130*a*, a first portion 129*b* comprising a P-type region 130*b*, a first portion 129*c* comprising an N-type region 130*c*, or a combination thereof, in some embodiments. In some embodiments, the guard structures 130 may comprise only a first portion 129*a* comprising a metal feature 130*a*, only a first portion 129*b* comprising an N-type region 130*c*, only a first portion 129*c* comprising a P-type region 130*b*, or a combination of two or more thereof, for example. The guard structures 130 may comprise a plurality of the first portions 129*a* comprising the metal features 130*a*, a plurality of the first portions 129*b* comprising the P-type regions 130*b*, a plurality of the first portions 129*c* comprising the N-type regions 130*c*, or a combination thereof, in other embodiments.

The first portions 129*a* comprising the metal features 130*a*, the first portions 129*b* comprising the P-type regions 130*b*, and the first portions 129*c* comprising the N-type regions 130*c* may comprise similar materials, may comprise similar dimensions, and may be formed using similar methods described herein (e.g., with reference to FIG. 4) for the metal features 130*a*, P-type regions 130*b*, and N-type regions 130*c*, respectively.

A portion of each of the guard structures 130 is disposed within a substrate 102 of the first semiconductor chip W1. For example, first portions 129*a*, 129*b*, and 129*c* are formed within the substrate 102. The guard structures 130 further include a second portion 133 disposed within an IMD 104 of the first semiconductor chip W1. For example, second portions 133 are formed in the IMD 104 and are coupled to first portions 129*a* in FIG. 9. Likewise, second portions 133 may be coupled to first portions 129*b* and 129*c*, as shown in FIG. 10 (see second portion 133*b* coupled to first portion 129*b* and second portion 133*c* coupled to first portion 129*c*). The second portions 133 may be coupled to one or more first portions 129*a* comprising the metal features 130*a*, first portions 129*b* comprising the P-type regions 130*b*, and/or first portions 129*c* comprising the N-type regions 130*c*, in accordance with some embodiments.

Referring again to FIG. 9, the second portion 133 of the guard structures 130 comprises a conductive via and/or a conductive via bar 108' or a conductive line or a conductive line segment 106' in some embodiments. The second portion 133 of the guard structures comprises a stack of a plurality of conductive vias or conductive via bars 108' and a plurality of conductive lines or conductive line segments 106' in some embodiments. The second portion 133 of the guard structures may comprise a metal stack of the conductive vias or conductive via bars 108' and the conductive lines or conductive line segments 106', for example.

In embodiments wherein the second portion 133 of the guard structures 130 comprises conductive vias 108', the conductive vias 108' may comprise a circular, square, or rectangular shape in a top view. One conductive via 108' or a plurality of conductive vias 108' may be disposed between conductive lines or conductive line segments 106' in the metal stack of the second portion 133. In embodiments wherein the second portion 133 comprises conductive via bars 108', the conductive via bars 108' may extend lengthwise between conductive lines or conductive line segments 106' in the metal stack of the second portion 133, along a portion of or the entire length of the conductive lines or conductive line segments 106' in the metal stack of the second portion 133.

In embodiments wherein the second portion 133 of the guard structures 130 comprises conductive lines 106', the conductive lines 106' may be continuous and may extend for a predetermined length, e.g., in a direction in and out of the paper in the view shown in FIG. 9. In embodiments wherein the second portion 133 of the guard structures 130 comprises conductive line segments 106', the conductive lines segments 106' may be discontinuous, and a plurality of the conductive line segments 106' may extend for a predetermined length in a direction in and out of the paper.

The conductive vias or conductive via bars 108' and conductive lines or conductive line segments 106' are advantageously formed in the same metallization or material layers that conductive vias 108*a* and conductive lines 106*a* are formed in an IMD 104*a*, as shown in FIG. 2, in some embodiments. Thus, no additional material layers or lithography or etch processes are required to form the second portions 133 of the guard structures 130. Existing lithography masks used to form the conductive vias 108*a* and conductive lines 106*a* within the IMD 104*a* may be modified to include the novel second portions 133 of the guard structures 130 comprising the metal stacks of conductive vias or conductive via bars 108' and conductive lines or conductive line segments 106'.

Each one of the plurality of conductive lines or conductive line segments 106' has a greater width than a width of an adjacent one of the plurality of conductive vias or conductive via bars 108' in some embodiments, also illustrated in FIG. 9. The conductive lines or conductive line segments 106' being wider than the conductive vias or conductive via bars 108' ensures that the vias 108' land on the conductive lines 106', and vice versa, to accommodate for process overlap variations, for example. Alternatively, the conductive lines or conductive line segments 106' and conductive vias or conductive via bars 108' may comprise substantially the same width, in other embodiments.

The second portion 133 of the guard structures 130 comprises one conductive via or conductive via bar 108' disposed between each two adjacent conductive lines or conductive line segments 106' in some embodiments. In some embodiments, the second portion 133 includes a conductive via or conductive via bar 108' disposed between one of the conductive lines or conductive line segments 106' and the first portion 129*a* of the guard structures 130 (see the top-most conductive vias or conductive via bars 108' in FIG. 9).

Some advantages of including the guard structures 130 that include the second portions 133 comprise providing additional guarding for contamination from metal materials such as copper or copper alloys, and other materials, from other structures in the semiconductor device 100, such as the through-vias 110*a*. Sidewalls of the through-vias 110*a* may contain contamination, and the guard structures 130 comprise ring-shaped structures or bar-shaped structures in the top view that provide isolation from the through-vias 110*a* (and also through-vias 110*b* and 110*c* shown in FIG. 10). In FIG. 9, noise, dark current, and/or white pixels 135 is illustrated being blocked by the novel second portions 133 comprising metal stacks of the guard structures 130. The guard structures 130 that include the second portions 133 provide improved isolation for the array region 112 and/or the peripheral region 116 from the through-vias 110*a*. Thus, performance of the semiconductor device 100 and yields are improved.

In some embodiments, the number of metal layers in the metal stacks of the second portions 133 may be determined as a function of the location of the stop layer used for the formation of the through-vias 110*a*. For example, in FIG. 9, the lower-most conductive line or conductive line segment 106' of the second portions 133 of the guard structures 130 resides in the same metallization or material layers as a conductive line 106 that is used as a stop layer for the formation of the through-via 110*a*. A lower portion of the through-via 110*a* is formed within an aperture in the conductive line 106 and below the conductive line 106 in some embodiments, for example. In other embodiments, the lower end of the through-via 110*a* terminates at the conductive line 106*a*, as shown in FIG. 10. In some embodiments, the through-vias 110*b* extend into a second semiconductor chip W2 bonded to the first semiconductor chip W1, or the through-vias 110*c* extend further into a third semiconductor chip Wn bonded to the second semiconductor chip W2, as shown in FIG. 10 in phantom, and as previously described herein.

FIG. 10 also illustrates some embodiments wherein second portions 133*a*, 133*b*, and 133*c* are coupled to each of the first portions 129*a*, 129*b*, and 129*c*, respectively. In other embodiments, second portions 133*a*, 133*b*, and 133*c* are coupled to only one or some of the first portions 129*a*, 129*b*, and 129*c*, respectively.

In the embodiments shown in FIGS. 9 and 10, the second portions 133, 133*a*, 133*b*, and 133*c* are formed in an IMD 104 and 104*a* of a first semiconductor chip W1. In other embodiments, the second portions 133 may also extend further into an IMD 104*b* of a second semiconductor chip W2 bonded to the first semiconductor chip W1, as shown in FIG. 11. For example, the IMD 104*b* of the second semiconductor chip W2 may be bonded to the IMD 104*a* of the first semiconductor chip W1. The second portions 133 of the guard structures 130 may be coupled to the first portions 129 and may comprise a plurality of conductive vias or conductive via bars 108*a'* and a plurality of conductive lines or conductive line segments 106*a'* formed in the IMD 104*a* of the first semiconductor chip W1. The second portions 133 also may comprise a plurality of conductive vias or conductive via bars 108*b*' and a plurality of conductive lines or conductive line segments 106*b*' formed in the IMD 104*b* of the second semiconductor chip W2. The plurality of conductive vias or conductive via bars 108*b*' and the plurality of conductive lines or conductive line segments 106*b*' may extend partially or fully through the IMD 104*b* of the second semiconductor chip W2.

In other words, the extensions of the second portion 133 of the guard structures 130 may comprise third portions 133' formed in the IMD 104*b* of the second semiconductor chip W2, as illustrated in FIG. 11. The guard structures 130 include the third portion 133' coupled to the second portion 133, wherein the third portion 133' is disposed in the IMD 104*b* of the second semiconductor chip W2. The third portion 133' comprises a stack of one or more conductive vias or conductive via bars 108*b*' and/or one or more conductive lines or conductive line segments 106*b*'. The conductive vias or conductive via bars 108*b*' of the third portion 133' are formed in the same metallization layer as conductive vias 108*b* formed in the IMD 104*b*. Likewise, the conductive lines or conductive line segments 106*b*' of the third portion 133' are formed in the same metallization layer as conductive lines 106*b* formed in the IMD 104*b*.

The guard structures 130 including the second portion 133 or the second portion 133 and the third portion 133' that comprise metal stacks can be implemented in the configurations illustrated in FIGS. 1 through 7. For example, as in the embodiments shown and described herein with respect to FIGS. 1 through 8, the first semiconductor chip W1 may include a plurality of the through-vias 110, 110*a*, 110*b*, and/or 110*c*, and the first semiconductor chip W1 may include a plurality of periphery devices 126 in the periphery region 116. The guard structures 130 including the second portion 133, or both the second portion 133 and the third portion 133', may be disposed proximate or around the array region 112 as shown in FIGS. 3 and 5, disposed proximate or around the plurality of through-vias as shown in FIGS. 3 and 5, disposed proximate or around the plurality of through-vias and the array region as shown in FIGS. 3 and 5, disposed proximate or around one of the plurality of through-vias as shown in FIG. 6, disposed proximate or around a group of the plurality of through-vias as shown in FIG. 6, disposed proximate or around one of the plurality of periphery devices as shown in FIG. 7, disposed proximate or around a group of the plurality of periphery devices as shown in FIG. 7, or a combination thereof.

Furthermore, the guard structures 130 that include the second portion 133 or the second portion 133 and the third portion 133' may substantially comprise a shape in a top view of the first semiconductor chip W1 of a square (FIG. 6), a rectangle (FIGS. 3, 5, 6, and 7), a continuous bar (FIGS. 3, 6, and 7), a plurality of continuous bars (FIGS. 3, 6, and 7), a non-continuous bar (FIG. 5), a plurality of non-continuous bars (FIG. 5), and/or combinations thereof.

The novel guard structures 130 are particularly useful when implemented in CMOS BSI image sensor devices and stacked CMOS BSI image sensor devices, as examples. The novel guard structures 130 are also implementable in many other types of semiconductor devices.

In some embodiments, a semiconductor device includes a semiconductor chip comprising an array region, a periphery region, and a through-via disposed therein. The semiconductor device includes a guard structure disposed in the semiconductor chip between the array region and the through-via or between the through-via and a portion of the periphery region. A portion of the guard structure is disposed within a substrate of the semiconductor chip.

In other embodiments, a method of manufacturing a semiconductor device includes providing a semiconductor chip comprising an array region, a periphery region, and a through-via disposed therein. A guard structure is formed in the semiconductor chip between the array region and the through-via or between the through-via and a portion of the periphery region. Forming the guard structure includes forming a first portion of the guard structure in a substrate of the semiconductor chip, and forming a second portion of the guard structure in an IMD of the semiconductor chip. The second portion of the guard structure is coupled to the first portion of the guard structure.

In yet other embodiments, an image sensor device includes a first semiconductor chip comprising an array region, a periphery region disposed around the array region, and a first through-via disposed between the array region and the periphery region. A second semiconductor chip is bonded to the first semiconductor chip. The second semiconductor chip includes a second through-via disposed therein. The second through-via is also disposed in the first semiconductor chip. The image sensor device includes a guard structure disposed in the first semiconductor chip between the array region and the first through-via or the second through-via, or between a portion of the periphery region and the first through-via or the second through-via. The guard structure includes a first portion comprising a metal feature, an N-type region, a P-type region, or a combination thereof. The guard structure includes a second portion comprising a metal stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first semiconductor chip comprising an array region, a periphery region, and a through-via disposed therein;

a guard structure disposed in the first semiconductor chip between the array region and the through-via or between the through-via and a portion of the periphery region, wherein a portion of the guard structure is disposed within a substrate of the first semiconductor chip; and a second semiconductor chip bonded to the first semiconductor chip, the second semiconductor chip comprising a second through via disposed therein, wherein the second through via is disposed at least partially in the first semiconductor chip.

2. The semiconductor device according to claim 1, wherein the portion of the guard structure comprises a first portion, and wherein the guard structure includes a second portion disposed in an inter-metal dielectric (IMD) of the first semiconductor chip.

3. The semiconductor device according to claim 2, wherein the second portion of the guard structure comprises a conductive via, a conductive via bar, a conductive line, or a conductive line segment.

4. The semiconductor device according to claim 2, wherein the second portion of the guard structure comprises a stack of a plurality of conductive vias or conductive via bars and a plurality of conductive lines or conductive line segments.

5. The semiconductor device according to claim 2, wherein the second portion of the guard structure comprises a metal stack.

6. The semiconductor device according to claim 2, wherein the first portion of the guard structure comprises a metal feature, an N-type region, a P-type region, or a combination thereof.

7. The semiconductor device according to claim 2, wherein the first semiconductor chip comprises a plurality of the through-vias; wherein the first semiconductor chip comprises a plurality of periphery devices in the periphery region; and wherein the guard structure is disposed proximate or around the array region, disposed proximate or around the plurality of the through-vias, disposed proximate or around the plurality of the through-vias and the array region, disposed proximate or around one of the plurality of the through-vias, disposed proximate or around a group of the plurality of the through-vias, disposed proximate or around one of the plurality of periphery devices, disposed proximate or around a group of the plurality of periphery devices, or a combination thereof.

8. The device according to claim 1, wherein the through via is disposed between the array region and the periphery region.

9. A method of manufacturing a semiconductor device, the method comprising:

providing a semiconductor chip comprising an array region, a periphery region, and a through-via disposed between the array region and the periphery region; and forming a guard structure in the semiconductor chip between the array region and the through-via or between the through-via and a portion of the periphery region, wherein forming the guard structure comprises forming a first portion of the guard structure in a substrate of the semiconductor chip, and forming a second portion of the guard structure in an inter-metal dielectric (IMD) of the semiconductor chip, the second portion of the guard structure being coupled to the first portion of the guard structure.

10. The method according to claim 9, wherein forming the second portion of the guard structure comprises forming a plurality of conductive vias or conductive via bars and a plurality of conductive lines or conductive line segments, and wherein each one of the plurality of conductive lines or conductive line segments has a greater width than a width of an adjacent one of the plurality of conductive vias or conductive via bars.

11. The method according to claim 10, wherein forming the second portion of the guard structure comprises forming one of the plurality of conductive vias or conductive via bars between each two adjacent ones of the plurality of conductive lines or conductive line segments, or forming one of the plurality of conductive vias or conductive via bars between one of the plurality of conductive lines or conductive line segments and the first portion of the guard structure.

12. The method according to claim 9, wherein providing the semiconductor chip comprises providing a complementary metal oxide semiconductor (CMOS) back side illumination (BSI) image sensor device.

13. The method according to claim 9, wherein forming the guard structure comprises forming a guard structure substantially comprising a shape in a top view of the semiconductor chip selected from the group consisting essentially of: a square, a rectangle, a continuous bar, a plurality of continuous bars, a non-continuous bar, a plurality of non-continuous bars, and combinations thereof.

14. The method according to claim 9, wherein forming the first portion of the guard structure comprises implanting the substrate of the semiconductor chip and/or epitaxially growing a material on the substrate of the semiconductor chip to form a P-type material, an N-type material, or a combination thereof.

15. The method according to claim 9, wherein forming the first portion of the guard structure comprises forming a trench in the substrate of the semiconductor chip, and filling the trench with a material.

16. The method according to claim 15, wherein filling the trench with the material comprises filling the trench with an insulating material, a conductive material, or a combination thereof.

17. The method according to claim 16, wherein filling the trench with the conductive material comprises filling the trench with a material selected from the group consisting essentially of: W, Cu, AlCu, and combinations thereof.

18. An image sensor device, comprising:

a first semiconductor chip comprising an array region, a periphery region disposed around the array region, and a first through-via disposed between the array region and the periphery region;

a second semiconductor chip bonded to the first semiconductor chip, the second semiconductor chip comprising a second through-via disposed therein, the second through-via also being disposed in the first semiconductor chip; and a guard structure disposed in the first semiconductor chip between the array region and the first through-via or the second through-via, or between a portion of the periphery region and the first through-via or the second through-via, wherein the guard structure comprises a first portion comprising a metal feature, an N-type region, a P-type region, or a combination thereof, and wherein the guard structure comprises a second portion comprising a metal stack.

19. The device according to claim 18, further comprising a first guard structure disposed in the first semiconductor chip between the array region and the first through-via or the second through-via, and a second guard structure disposed in the first semiconductor chip between a portion of the periphery region and the first through-via or the second through-via.

20. The device according to claim 18, wherein the image sensor device comprises a stacked complementary metal oxide semiconductor (CMOS) back side illumination (BSI) image sensor device.

* * * * *